(12) United States Patent
Chang et al.

(10) Patent No.: US 10,067,418 B2
(45) Date of Patent: Sep. 4, 2018

(54) PARTICLE REMOVAL SYSTEM AND METHOD THEREOF

(71) Applicant: Taiwan Semiconductor Manufacturing Company, Ltd., Hsin-Chu (TW)

(72) Inventors: Shu-Hao Chang, Taipei (TW); Chi-Lun Lu, Hsinchu (TW); Shang-Chieh Chien, New Taipei (TW); Ming-Chin Chien, Hsinchu (TW); Jui-Ching Wu, Hsinchu (TW); Jeng-Horng Chen, Hsin-Chu (TW); Chieh-Jen Cheng, Hsinchu (TW); Chia-Chen Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 893 days.

(21) Appl. No.: 14/275,601

(22) Filed: May 12, 2014

(65) Prior Publication Data
US 2015/0323862 A1    Nov. 12, 2015

(51) Int. Cl.
*B08B 7/00*       (2006.01)
*G03F 1/82*       (2012.01)

(52) U.S. Cl.
CPC .............. *G03F 1/82* (2013.01); *B08B 7/0021* (2013.01)

(58) Field of Classification Search
CPC ................................ B08B 7/0021; G03F 1/82
See application file for complete search history.

(56) References Cited

U.S. PATENT DOCUMENTS

| | | | | |
|---|---|---|---|---|
| 5,367,139 A | * | 11/1994 | Bennett | C23C 16/44 156/345.44 |
| 6,136,256 A | * | 10/2000 | Bingham | H01J 37/32431 118/723 R |
| 2001/0006418 A1 | * | 7/2001 | Dao | G03F 1/62 356/337 |
| 2006/0237667 A1 | | 10/2006 | Ruzic et al. | |

(Continued)

OTHER PUBLICATIONS

A. Rastegar, Matthew House and Arun John Kadaksham, "Cleaning Challenges of EUV Mask Substrates, Blanks, and Patterned Mask," ECS Transactions, 41 (5), 139-146, 2011, The Electrochemical Society.

(Continued)

*Primary Examiner* — Alexander Markoff
(74) *Attorney, Agent, or Firm* — Haynes and Boone, LLP

(57) ABSTRACT

A method of removing particles from a surface of a reticle is disclosed. The reticle is placed in a carrier, a source gas is flowed into the carrier, and a plasma is generated within the carrier. Particles are then removed from a surface of the reticle using the generated plasma. A system of removing particles from a surface includes a carrier configured to house a reticle, a reticle stocker including the carrier, a power supply configured to apply a potential between an inner cover and an inner baseplate of the carrier, and a gas source configured to flow a gas into the carrier. A plasma may be generated within the carrier, and particles can be removed from a surface of the reticle using the generated plasma. An acoustic energy source configured to agitate at least one of the source gas and the generated plasma may be provided to facilitate particle removal using an agitated plasma.

20 Claims, 11 Drawing Sheets

(56) References Cited

U.S. PATENT DOCUMENTS

| | | | | |
|---|---|---|---|---|
| 2007/0163715 | A1* | 7/2007 | Rastegar | H01L 21/306 |
| | | | | 21/306 |
| 2010/0151394 | A1* | 6/2010 | Scaccabarozzi | G03F 7/70925 |
| | | | | 430/325 |
| 2013/0255407 | A1* | 10/2013 | Chilese | G03F 7/70691 |
| | | | | 73/865.8 |
| 2014/0014138 | A1* | 1/2014 | Spiegelman | B08B 3/04 |
| | | | | 134/31 |
| 2014/0085618 | A1* | 3/2014 | Delgado | G03F 7/70916 |
| | | | | 355/30 |

OTHER PUBLICATIONS

Sherjang Singh, Uwe Dietze and Peter Dress, "Extending Ru Capping Layer Durability under Physical Force Cleaning," Extreme Ultraviolet (EUV) Lithography IV, edited by Patrick P. Naulleau, Proc. of SPIE vol. 8679, 86791E, 2013.

Abbas Rastegar and Vibhu Jindal, "EUV Mask Defects and Their Removal," 28th European Mask and Lithography Conference, edited by Uwe F. W. Behringer, Wilhelm Maurer, Proc. of SPIE vol. 8352, 83520W, 2012.

Claire Tendero, Christelle Tixier, Pascal Tristant, Jean Demaison and Philippe LePrince, "Atmospheric Pressure Plasmas: A Review", (Spectrochimica Acta Part B: Atomic Spectroscopy, vol. 61, No. 1, pp. 2-30, 2006), www.elsevier.com/locate/sab.

* cited by examiner

PARTICLE REMOVAL SYSTEM AND METHOD THEREOF

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, semiconductor lithography processes may use lithographic templates (e.g., photomasks or reticles) to optically transfer patterns onto a substrate. Such a process may be accomplished, for example, by projection of a radiation source, through an intervening photomask or reticle, onto the substrate having a photosensitive material (e.g., photoresist) coating. The minimum feature size that may be patterned by way of such a lithography process is limited by the wavelength of the projected radiation source. In view of this, extreme ultraviolet (EUV) radiation sources and lithographic processes have been introduced. However, EUV processes are very sensitive to contamination issues. In one example, particle contamination introduced onto an EUV lithographic template can result in significant degradation of the lithographically transferred pattern. Existing mask-cleaning techniques such as wet chemical processes, in some cases with the addition of physical force, may result in structural mask defects which can also cause a reduction in the quality of the transferred pattern. Thus, existing mask-cleaning techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
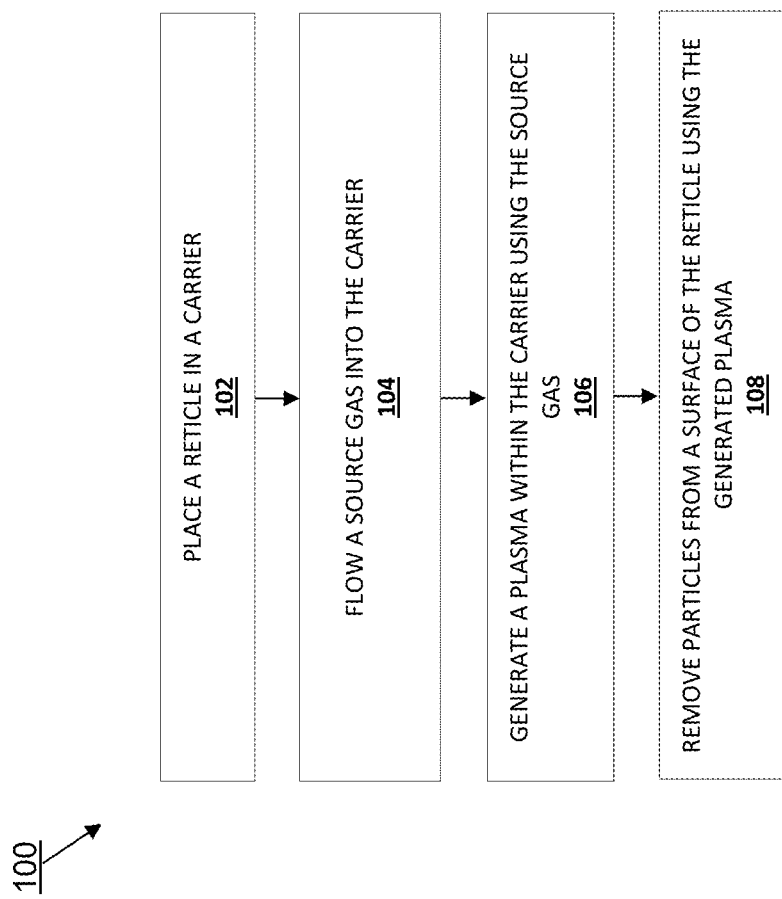
FIG. 1 is a flow chart illustrating an embodiment of a method of removing particles from a surface in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
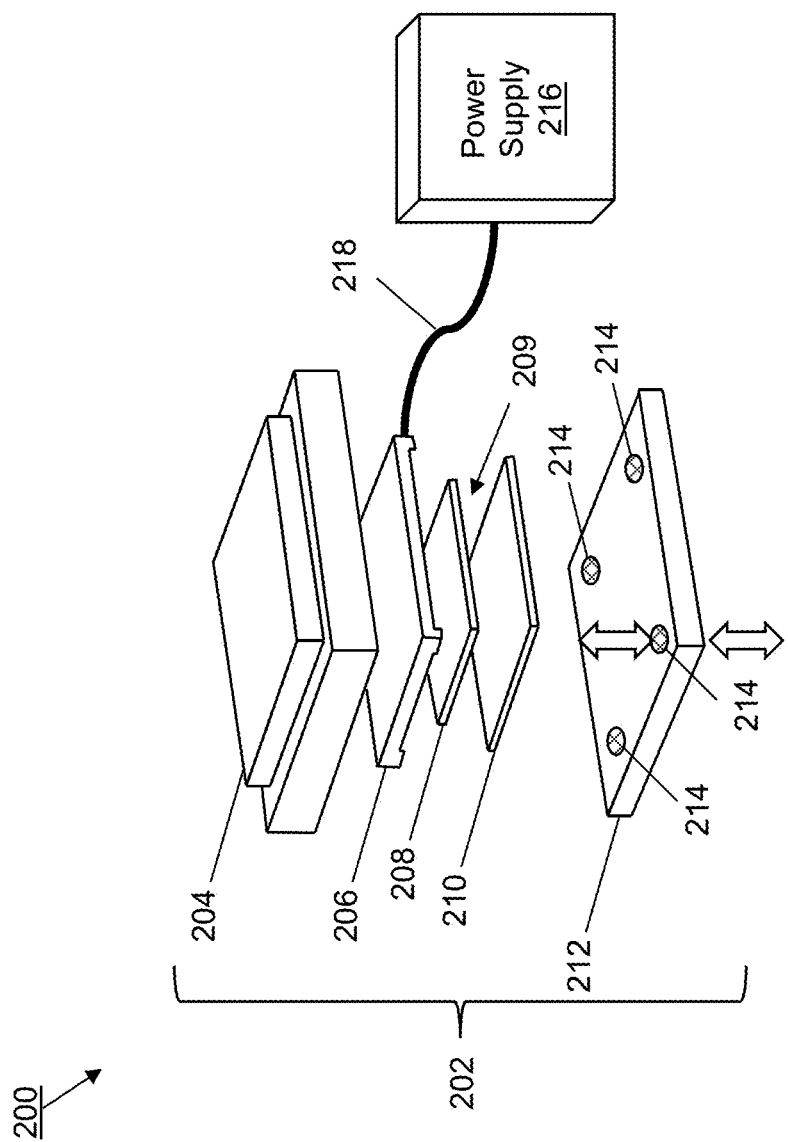
FIG. 2 is a schematic diagram of a system for removing particles from a surface according to one or more steps of the method of FIG. 1 and in accordance with some embodiments.
Figure 3:
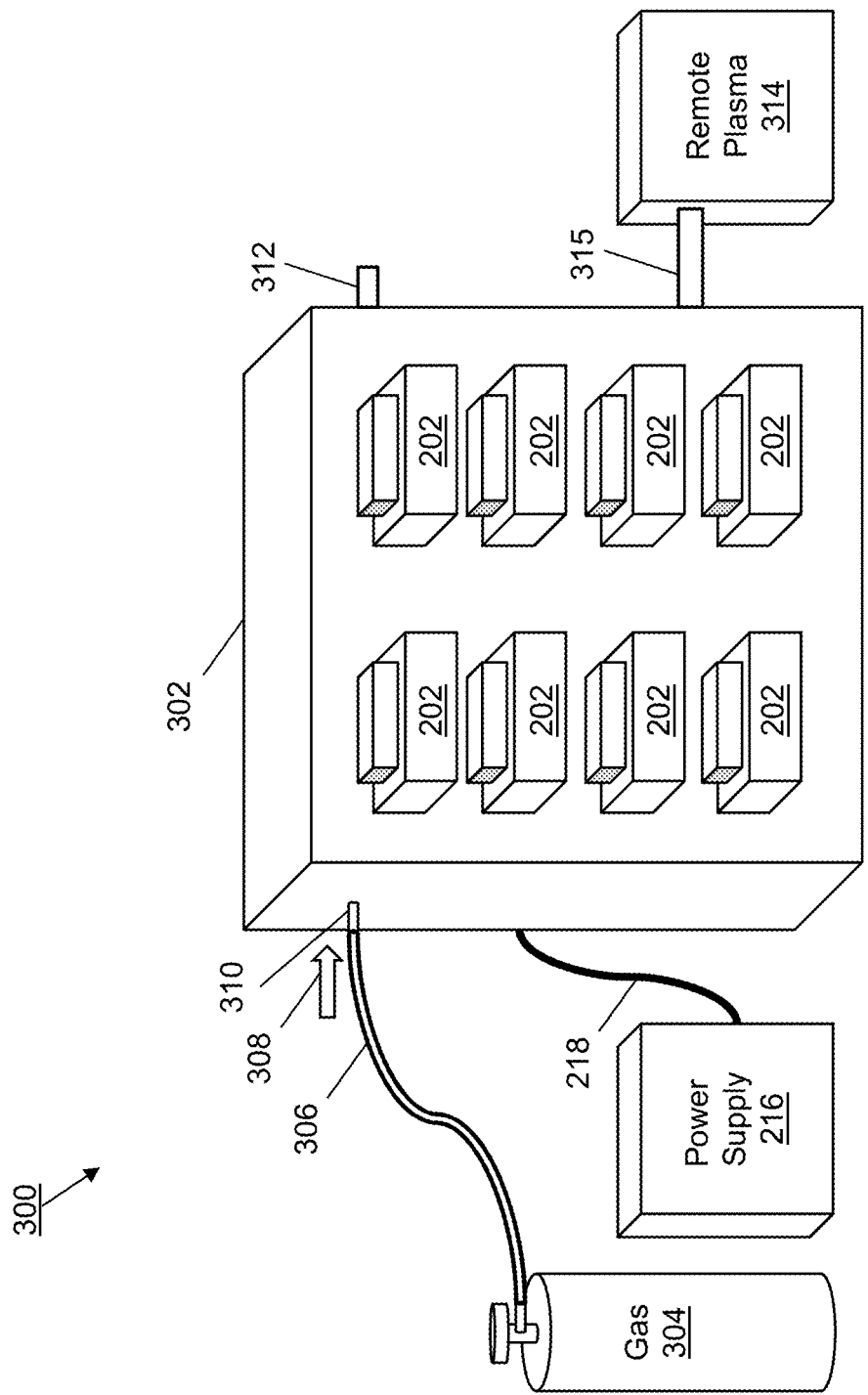
FIG. 3 is a schematic diagram of a system for removing particles from a surface according to one or more steps of the method of FIG. 1 and in accordance with other embodiments.

FIG. 1 illustrates a method 100 to remove particles from a surface such as a surface of a photomask, reticle, or other optics component as described herein. FIGS. 2 and 3 illustrate schematic diagrams of a system for removing particles from such a surface according to various aspects of the present disclosure and the method of FIG. 1. The method 100 and the systems 200, 300 are collectively described below. However, additional steps can be provided before, after or during the method 100, and some of the operations described herein may be replaced by other operations or eliminated. Similarly, further additional features may be present in the systems 200, 300 and/or features present may be replaced or eliminated in additional embodiments.

Referring now to FIG. 1, the method 100 begins at block 102 where a reticle is placed in a carrier. Referring to the embodiments of FIG. 2 and FIG. 3, a reticle 208 is placed in a carrier 202. In some embodiments, the reticle 208 includes an extreme ultraviolet (EUV) lithography reticle. As described herein, the carrier 202 may be a dual pod carrier including an outer pod and an inner pod. The outer pod includes a carrier door 212 and a carrier shell 204, and the inner pod includes an inner baseplate 210 and an inner cover 206. In some embodiments, the inner baseplate 210 and the inner cover 206 include a conductive material, which may be used to apply a voltage potential to generate a plasma, as discussed below. In addition, for example when the carrier 202 is in a closed configuration (i.e., an "in-use" configuration), the conductive materials of the inner baseplate 210 and the inner cover 206 are not in contact; rather, in some embodiments, non-conductive pins (not shown) disposed between the inner baseplate 210 and the inner cover 206 may be used to create a vertical separation (i.e., a vertical spacing) between the inner baseplate 210 and the inner cover 206. Such separation between the inner baseplate 210 and the inner cover 206 provides for the creation of a potential difference, as discussed below, between the inner cover 206 or the inner baseplate 210, which is used for plasma generation. As shown in FIG. 2, the reticle 208 is housed within the inner pod between the inner baseplate 210 and the inner cover 206. Additionally, in some embodiments, the reticle 208 is oriented face-down within the inner pod, leaving a small gap between a front surface 209 of the reticle 208 and the inner baseplate 210, to minimize particle contamination of the front surface 209. In some embodiments, the inner pod cover 206 includes one or more openings (not shown) to allow for the flow of gas within the inner pod. In other embodiments, the carrier may include a single pod carrier, a pod having a removable pellicle, and/or other type of carrier as known in the art. At various times throughout a semiconductor process, the carrier 202, including the reticle 208, may be stored in a reticle stocker 302. As illustrated in FIG. 3, the reticle stocker 302 may simultaneously house a plurality of carriers 202, and thus a plurality of reticles 208.

The method 100 then proceeds to block 104 where a source gas is flowed into the carrier. By way of example, the source gas may be provided by a gas source 304, which is coupled to a gas port 310 of the reticle stocker 302 by way of a hose 306. The source gas may then be further directed within the carrier 202 by way of one or more of ports 214. Additionally, the source gas may be directed within the inner pod of the carrier 202 by way of one or more ports (not shown). In some examples, the inner pod is not completely sealed, as discussed above, due to the non-conductive pins which create a separation between the inner baseplate 210 and the inner cover 206. As such, in some embodiments, gas may diffuse from the outer pod to the inner pod by way of the separation between the inner baseplate 210 and the inner cover 206. In some embodiments, the reticle stocker 302 also includes a gas exhaust port 312. While only one gas source 304, and gas ports 310 and 312 are shown, any number of gas sources and gas ports are envisioned to fall within the scope of this disclosure. In some embodiments as described herein, the source gas includes one of molecular hydrogen and water vapor. In other embodiments, the source gas is mixed with at least one inert gas such as helium, neon, argon, krypton, xenon, and radon. In various embodiments which include a gas mixture, the constituent gases may be mixed prior to introduction into the reticle stocker 302 or they may be alternatively mixed within the reticle stocker 302. In one embodiment including a hydrogen-inert gas mixture, the gas mixture includes a hydrogen concentration of less than about 3 percent. In the examples described herein, a hydrogen concentration of less than about 3 percent is described in order to maintain a sufficient margin of safety.

The method 100 then proceeds to block 106 where a plasma is generated within the carrier using the source gas. In some embodiments, the plasma may be generated within the carrier 202 (FIG. 2). Alternatively or additionally, the plasma is generated within the inner pod of the carrier 202. Plasma generation may be initiated by application of a voltage potential from a power supply 216. In the various embodiments described herein, the power supply 216 may include one of a direct current (DC) power supply and a radio frequency (RF) power supply. In some embodiments, a frequency of the power supply is approximately 1 kHz to 40 kHz. In some embodiments, a power supply voltage value is approximately 1 kV to 30 kV. In other examples, a supply voltage of less than about 1 kV may not generate sufficiently strong plasma. In some embodiments, the power supply 216 is coupled directly to one of the inner cover 206 or the inner baseplate 210 by way of a power cable 218, while concurrently grounding the other of the inner cover 206 or the inner baseplate 210, in order to create a potential difference between the inner cover 206 and the inner baseplate 210, which may act as a parallel-plate reactor. At a sufficiently high potential, in the presence of a source gas or gas mixture, the gas or gas mixture can be ionized and thereby generate a plasma. In some embodiments, the generated plasma includes ions as well as activated neutral species which may enhance chemical reactions of the ionic species with the surface to be cleaned (i.e., etched). Ions, which may be reactive, can be accelerated toward a surface to be cleaned (e.g., a front surface 209 of the reticle 208) by way of the potential difference between the inner cover 206 and the inner baseplate 210. Illustratively, a combination of the ion bombardment and a chemical reaction of the ionic species with the surface to be cleaned provides for the effective removal (e.g., by etching) of for example, contaminants from a surface of an EUV reticle, optics component, and/or other surface as described herein.

In other embodiments, the power supply 216 is coupled indirectly (e.g., by way of a power supply connection to the reticle stocker 302) to one of the inner cover 206 or the inner baseplate 210 of one or more of the carriers 202 (FIG. 3), while concurrently grounding the other of the inner cover 206 or the inner baseplate 210. As described above, such a configuration can be used to create a potential difference between the inner cover 206 and the inner baseplate 210 within one or more of the carriers 202 within the reticle stocker 302, and subsequently generate a plasma within one or more of the carriers 202. In the presence of a source gas or a gas mixture, as described above, the applied voltage potential within the carriers 202 may ionize the gas or gas mixture to generate the plasma, clean the front surface 209 of one or more reticles 208 houses in the one or more carriers 202. In other embodiments, the system 300 includes a remote plasma source 314 coupled to the reticle stocker 302 by way of a conduit 315. The remotely generated plasma may be directed within the inner pod of one or more of the carriers 202 by way of one or more conduits (not shown).

The method 100 then proceeds to block 108 where particles are removed from a surface of the reticle using the generated plasma. Referring to the example of FIG. 2, a plasma generated within the inner pod of the carrier 202 is used to remove particles from the front surface 209 of the reticle 208. In some embodiments, the plasma may be generated within the small gap between the front surface 209 of the reticle 208 and the inner baseplate 210. In other embodiments, the generated plasma may occupy substantially the entire volume of the inner pod of the carrier 202. The generated plasma will thereby clean (i.e., remove particles) surfaces which are exposed to the plasma. For example, in various embodiments described herein, a plasma generated within the inner pod of the carrier 202 functions to remove particles from the front surface 209 of the reticle 208.

Figure 9:
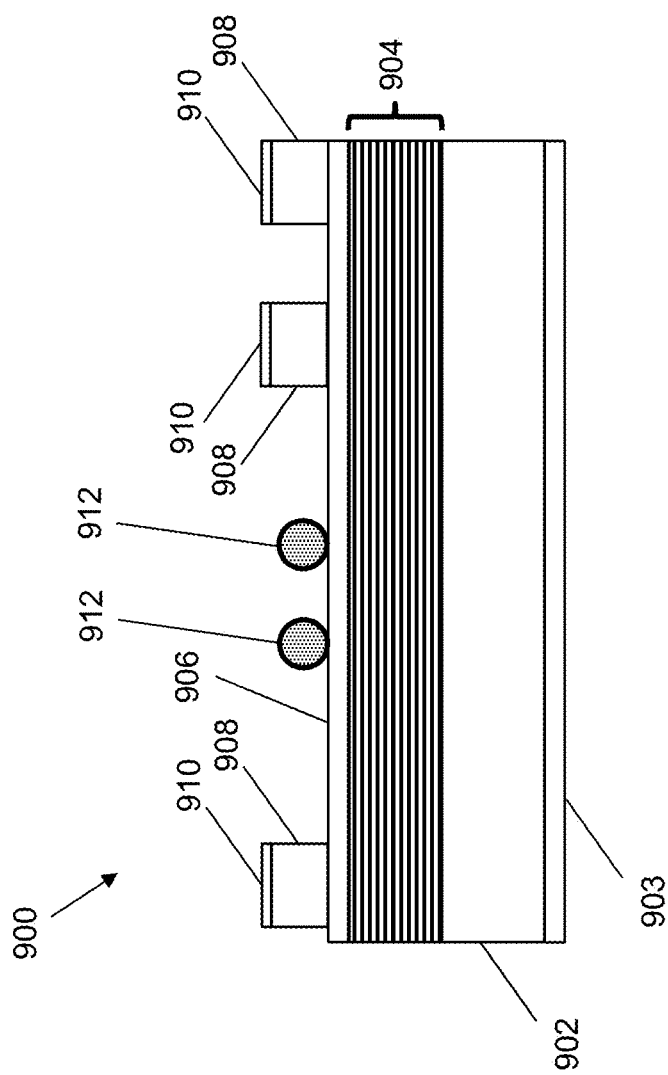
FIG. 9 is a cross-section of an extreme ultraviolet (EUV) reticle including a ruthenium capping layer, in accordance with some embodiments.

In some embodiments, for example for EUV applications, the front surface 209 of the reticle 208 may include a layer of ruthenium (Ru), as illustrated in FIG. 9 (capping layer 906). Specifically, FIG. 9 shows an example of an EUV reticle 900 including a substrate 902 having a backside coating layer 903, a multi-layer structure 904, a capping layer 906, and one or more absorbers 908 having an anti-reflective coating (ARC) layer 910. In some embodiments, the substrate 902 includes a low thermal expansion material (LTEM) substrate, and the backside coating layer 903 includes a chromium nitride ($Cr_xN_y$) layer. In some examples, substrate 902 has a thickness of about 6.3 to 6.5 mm. In some examples, the backside coating 903 has a thickness of about 70-100 nm. By way of example, the multi-layer structure 904 may include molybdenum-silicon (Mo—Si) multi-layers deposited on top of the substrate 902 for example, using an ion deposition technique. In some embodiments, the multi-layer structure 904 has a thickness of about 250-350 nm, and in some examples each Mo—Si layer pair has a thickness of about 3 nm (for the Mo layer) and about 4 nm (for the Si layer). In various embodiments, the capping layer 906 includes a Ru capping layer, as describe above, which in some examples may have a thickness of about 2.5 nm. In other examples, the capping layer 906 may include a Si capping layer having a thickness of about 4 nm. The capping layer 906 may help to protect the multi-layer structure 904 (e.g., during mask manufacturing) and may also serve as an etch-stop layer for a subsequent absorber layer etch process. In some embodiments, the absorbers 908 may include for example, a $Ta_xN_y$ layer or a $Ta_xB_yO_zN_u$ layer, which may have a thickness of about 50-75 nm and are configured to absorb extreme ultraviolet light (e.g., with a wavelength of about 13.5 nm). In some examples, the ARC layer 910 includes at least one of a $Ta_xB_yO_zN_u$ layer, a $Hf_xO_y$ layer, or a $Si_xO_yN_z$ layer. As shown in FIG. 9, particles 912 may be unintentionally deposited on the surface of the capping layer 906 and can result in degradation of lithographically transferred patterns if not removed. Particles 912 may be introduced by any of a variety of methods such as during a chemical mechanical polishing (CMP) process, a cleaning process, and/or during handling of the EUV reticle 900. While the particles 912 are illustrated as having a circular shape, it will be understood that other particle shapes and sizes are possible, and are intended to fall within the scope of the present disclosure.

Due to the detrimental impact of particles on EUV reticles such as the particles 912 on the EUV reticle 900, many different types of cleaning techniques have been explored and are currently being used. Some examples of existing reticle-cleaning techniques employ a physical force wet-clean technique (e.g., megasonic and droplet spray cleaning) which can result in structural mask defects including pitting of the Ru capping layer 906. For example, in wet megasonic cleaning methods, surface particles may be responsible for bubble growth at a particle site and subsequent transient cavitation which causes surface damage of the capping layer 906 upon implosion. Other existing methods, such as including ozone treatment (e.g., ozonated water), de-ionized water, and spin drying, can also cause EUV mask damage as Ru may be easily oxidized, resulting in oxidation of the capping layer 906. In some embodiments, oxidation of the capping layer 906 results in a substantial loss of EUV reflectivity, which is also detrimental to the EUV lithographic process. A dry-clean plasma process, for example using one or more of the embodiments described herein, offers the advantage of cleaning sensitive EUV reticles while avoiding pitting and/or oxidation of the Ru surface of the capping layer 906.

In alternative embodiments of the method 100 and the examples illustrated in FIGS. 1 and 2, a surface of the reticle 208 (e.g., the front surface 209 or a surface of the capping layer 906) may be cleaned by exposure to hydrogen radicals. In accordance with some embodiments, and due in part to a difference in their respective physical cleaning mechanisms, the hydrogen radicals target the removal of small particles as compared to the larger particles targeted by an acoustic energy source, as discussed below. In one example, source hydrogen gas can be heated to a temperature at which the hydrogen molecules dissociate into hydrogen atoms (i.e., hydrogen radicals) which are very active and effectively remove surface contaminants. In some embodiments, the hydrogen gas is heated to a temperature above about 1700 degrees Celsius. For example, in some embodiments, the gas source 304 may include a heater configured to heat the source gas and generate the hydrogen radicals. In other embodiments, a heater may be coupled inline within the hose 306, thereby providing the hydrogen radicals to the reticle stocker 302 by way of the gas port 310. In yet other embodiments, the reticle stocker 302 may include a heater disposed within an interior portion of the reticle stocker 302 and coupled to the gas port 310, and thereby configured to heat the source gas, generate hydrogen radicals, and direct the hydrogen radicals to one or more of the carriers 202 via one or more conduits (not shown). In some embodiments, when the hydrogen gas is heated to form hydrogen radical for cleaning the reticle surface (e.g., the front surface 209 or a surface of the capping layer 906), a voltage may not be concurrently applied to generate a plasma, as discussed above. In other embodiments, a mixture of water vapor is mixed with one or more of the inert gases described above to clean the reticle 208. In embodiments disclosed herein, an acoustic energy source (i.e., ultrasonic transducer) can be used to vaporize water (e.g., to form the water vapor) and/or vaporize a water/inert gas mixture. In some embodiments, by using water at a cool temperature, the likelihood of oxidizing the Ru surface can be reduced. In some embodiments, water at a cool temperature may include water at a temperature less than about the boiling point of water (100° C.). In other embodiments, water at a cool temperature may include water at a temperature between about 10° C. to about 40° C. In addition, in various embodiments, the water vapor/inert gas mixture may be used to generate a plasma, as described above.

Figure 4:
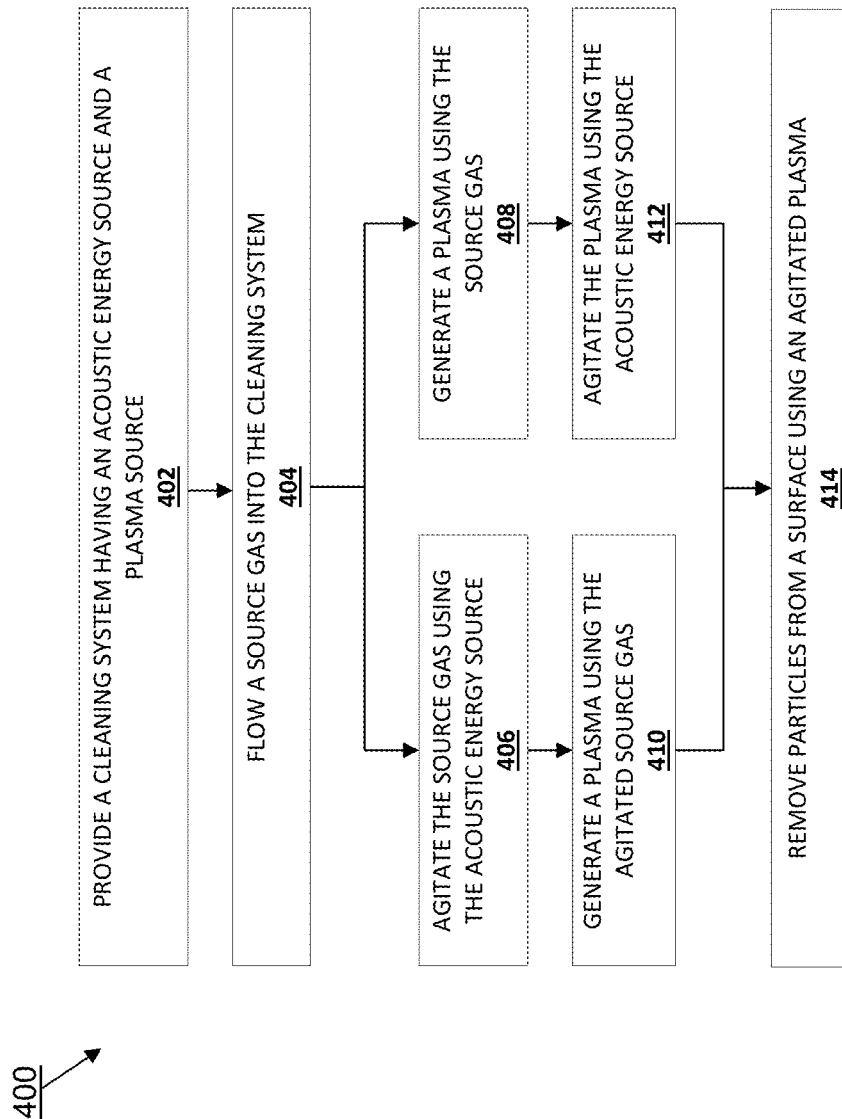
FIG. 4 is a flow chart illustrating an embodiment of a method of removing particles from a surface in accordance with other embodiments.

FIG. 4 illustrates a method 400 to remove particles from a surface (e.g., the front surface 209, a surface of the capping layer 906, or a surface 705 or 805 as discussed below) in accordance with other embodiments. FIGS. 5-8 illustrate schematic diagrams of a system for removing particles from a surface using a plasma source and an acoustic energy source (e.g., an ultrasonic transducer), according to various aspects of the present disclosure and the method of FIG. 4. In accordance with some embodiments, and due in part to a difference in their respective physical cleaning mechanisms, the acoustic energy source targets the removal of large particles, and the plasma source targets the removal of smaller particles than those targeted by the acoustic energy source. The method 400 and the systems 500, 600, 700, 800 are collectively described below. However, additional steps can be provided before, after or during the method 400, and some of the steps described herein may be replaced by other steps or eliminated. Similarly, further additional features may be present in the systems 500, 600, 700, 800 and/or features present may be replaced or eliminated in additional embodiments.

Figure 5:
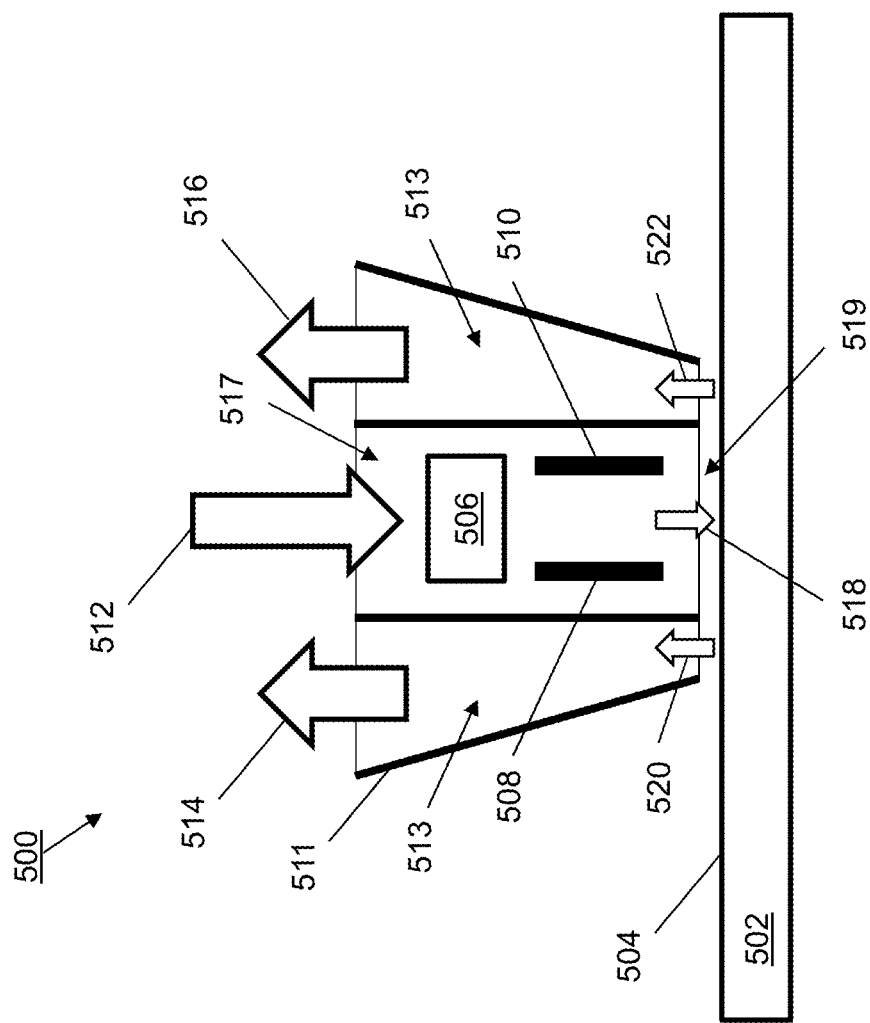
FIG. 5 is a schematic diagram of a system for removing particles from a surface according to one or more steps of the method of FIG. 4 and in accordance with some embodiments.
Figure 6:
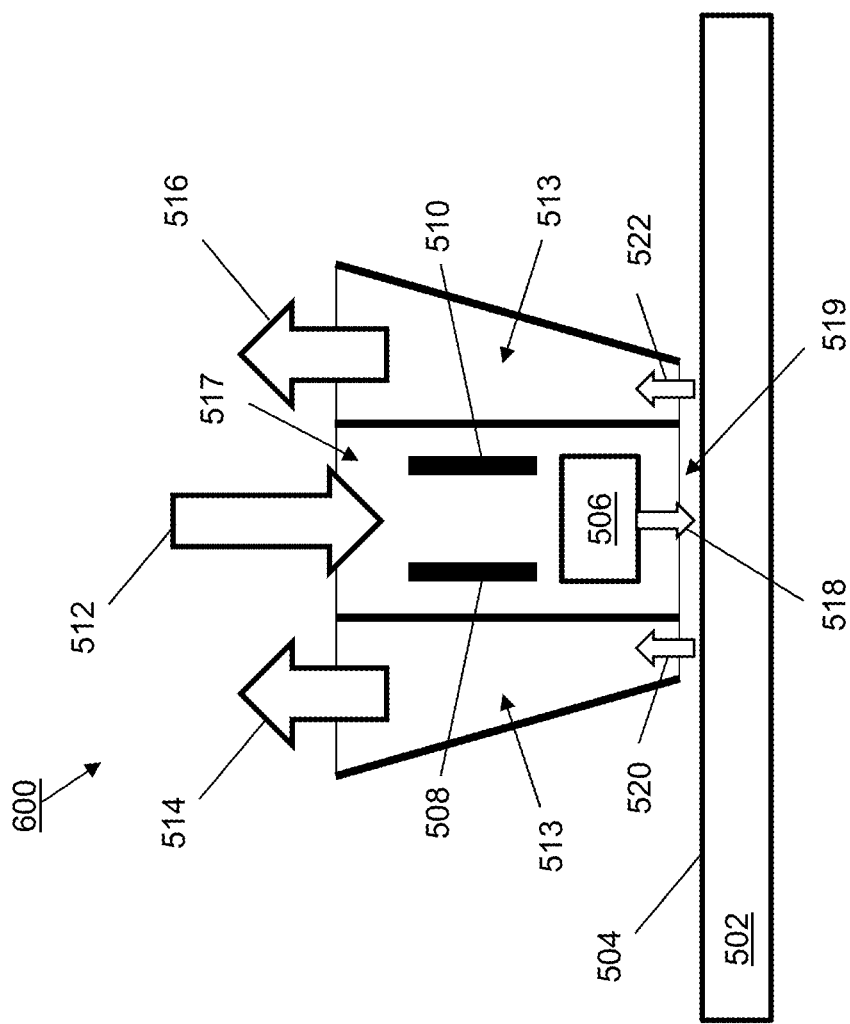
FIG. 6 is a schematic diagram of a system for removing particles from a surface according to one or more steps of the method of FIG. 4 and in accordance with other embodiments.

Referring now to FIG. 4, the method 400 begins at block 402 where a cleaning system having an acoustic energy source and a plasma source is provided. In the example of FIG. 5, the cleaning system includes a system 500 having a housing 511, a gas supply channel 517, and one or more gas purge channels 513. As shown in FIG. 5, an acoustic energy source 506 (e.g., an ultrasonic transducer) is disposed within the gas supply channel 517. A plasma source, including a first electrode 508 and a second electrode 510, is disposed proximate to and downstream of the acoustic energy source 506. In various embodiments, the first electrode 508 and/or the second electrode 510 of the plasma source may be coupled to a power supply (e.g., the power supply 216), whereby the plasma source can apply a voltage potential to a gas or gas mixture to generate a plasma. In alternative embodiments, for example in a system 600 as shown in FIG. 6, the plasma source, including the first electrode 508 and the second electrode 510, is disposed proximate to and upstream of the acoustic energy source 506.

The method 400 then proceeds to block 404 where a source gas is flowed into the cleaning system. A gas may be provided by the gas source 304, as described above with reference to FIG. 3, and flowed through the gas supply channel 517 as indicated by arrows 512 and 518. Gas, and particle contamination (as discussed below), may subsequently be purged via the gas purge channels 513 as indicated by arrows 514/520 and 516/522. In some embodiments, a vacuum may be applied to the gas purge channels 513 to facilitate purging of the gas and particles.

Thereafter, dependent on the embodiment of the cleaning system (e.g., the system 500 or the system 600), the method 400 then proceeds to block 406 or block 408. For example, in embodiments including the system 500 where the plasma source is disposed downstream of the acoustic energy source 506, the method 400 proceeds to block 406 where the source gas is agitated using the acoustic energy source 506. The method then proceeds to block 410 where a plasma is generated using the agitated source gas. In an embodiment of block 410, and with reference to FIG. 5, a plasma is generated by a voltage potential applied between the first and second electrodes 508, 510 to the agitated gas or agitated gas mixture, resulting in an agitated plasma. In some embodiments, as described herein, the term "agitated plasma" may include a combination of an ultrasonically agitated (e.g., via the acoustic energy source) gas or gas mixture (which may primarily target the removal of large particles on a surface 504) and a plasma including an ionized and/or partially ionized gas or gas mixture (which may primarily target the removal of particles smaller than those targeted by the ultrasonically agitated gas or gas mixture). In embodiments described herein, and with reference to FIGS. 5 and 6, the plasma source may include an atmospheric pressure plasma system which may be readily integrated with the acoustic energy source 506. A detailed discussion of atmospheric pressure plasmas sources and their applications, as well as other plasma-related topics, is described in the publication *Atmospheric Pressure Plasmas: A Review* by C. Tendero et al. (*Spectrochimica Acta Part B: Atomic Spectroscopy*, Vol. 61, No. 1, pp. 2-30, 2006), and is incorporated herein by reference. The method then proceeds to block 414 where particles from a surface are removed using the agitated plasma. As described above with reference to FIGS. 1-3, the surface may include a surface of a photomask, reticle, or other optics component. Considering the example of FIG. 5, a reticle 502 having a surface 504 is shown. Thus, the plasma generated by the system 500 will clean (i.e., remove particles) the surface 504 which is exposed to the plasma. Removed particles and gas/gas mixtures are then purged from the surface 504 via the gas purge channels 513, for example, using an applied vacuum.

In embodiments including the system 600, where the plasma source is disposed upstream of the acoustic energy source 506, after the gas is flowed into the cleaning system (block 404), the method 400 proceeds to block 408 where a plasma is generated using the source gas. For example, in an embodiment of block 408, and with reference to FIG. 6, a plasma is generated by a voltage potential applied between the first and second electrodes 508, 510 to the source gas or gas mixture. The method then proceeds to block 412 where the generated plasma is agitated using the acoustic energy source. Thereafter, particles are removed from a surface using the agitated plasma (block 414), as described above.

Figure 7A:
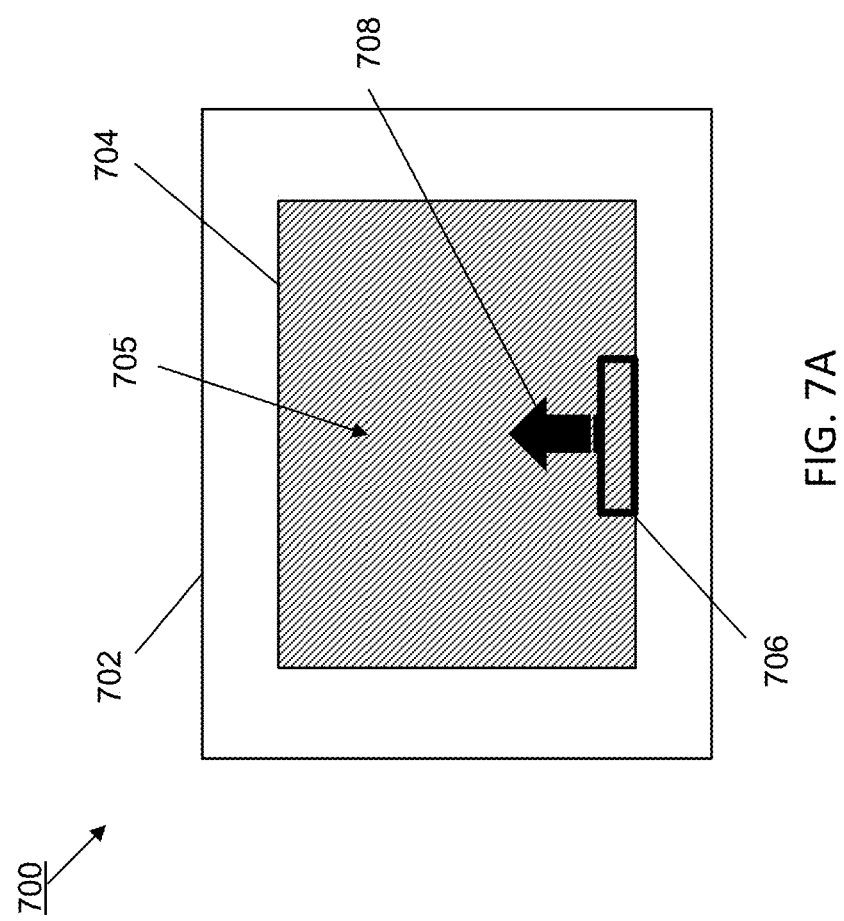
FIG. 7A is a schematic diagram illustrating a top-view of a system for removing particles from a surface according to one or more steps of the method of FIG. 4 and with reference to the systems of FIGS. 5 and 6, in accordance with some embodiments.
Figure 7B:
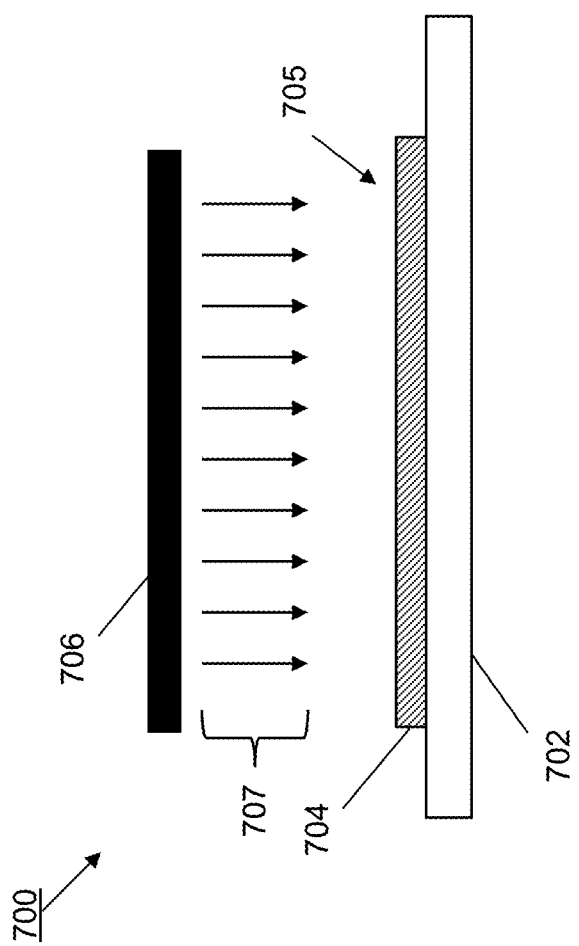
FIG. 7B is a schematic diagram illustrating a side-view of a system for removing particles from a surface according to one or more steps of the method of FIG. 4 and with reference to the systems of FIGS. 5 and 6, in accordance with some embodiments.

Referring now to FIG. 7, an embodiment of a cleaning system 700 is illustrated. By way of example, FIG. 7A shows a top-view and FIG. 7B shows a side-view, respectively, of a cleaning system 700. Considering FIGS. 7A and 7B, a photomask or reticle 704 having a surface 705 is disposed on a chuck 702 and positioned for cleaning by the system 700. In some embodiments, a slit 706 as illustrated in FIGS. 7A and 7B may correspond to a portion of systems 500, 600 as discussed above with reference to FIGS. 4-6. For example, the slit 706 may correspond to an end portion indicated by arrow 519 (FIGS. 5 and 6) of systems 500, 600, where the agitated plasma generated by the cleaning systems 500, 600 is exposed to a surface (e.g., a surface 504 of FIG. 5 or 6, or a surface 705 of FIG. 7). As shown in FIG. 7B, the agitated plasma is represented by arrows 707. Additionally, in some embodiments, the slit 706 (and hence the systems 500, 600), may be implemented to scan across the surface 705 as indicated by arrow 708. In some embodiments, the slit 706 is scanned across the surface 705 using one of a raster scan or a vector scan. It will be apparent to one skilled in the art that such a system may be advantageously implemented as part of a semiconductor process flow, for example, between reticle uses to minimize contamination during each exposure. For example, in various embodiments, the slit 706 (and hence the systems 500, 600), may be implemented as part of an EUV scanner to prevent/remove tin (Sn) contamination, for example by implementing the systems 500, 600 using hydrogen radicals, as described above. In such an embodiment, Sn will react with the hydrogen radicals and produce $SnH_4$, which is a gas that can be effectively removed via the gas purge channels 513 (FIGS. 5 and 6). In other embodiments, the system 700 can be used to prevent oxidation and carbon contamination of the surface 705. As a more general example, removal of particles from the surface 705 by the system 700 may include applying a vacuum at the slit 706, which corresponds to applying a vacuum to the gas purge channels 513 (FIGS. 5 and 6), which is effective for particle and/or other contamination removal as well as for purging of gas/gas mixtures.

Figure 8A:
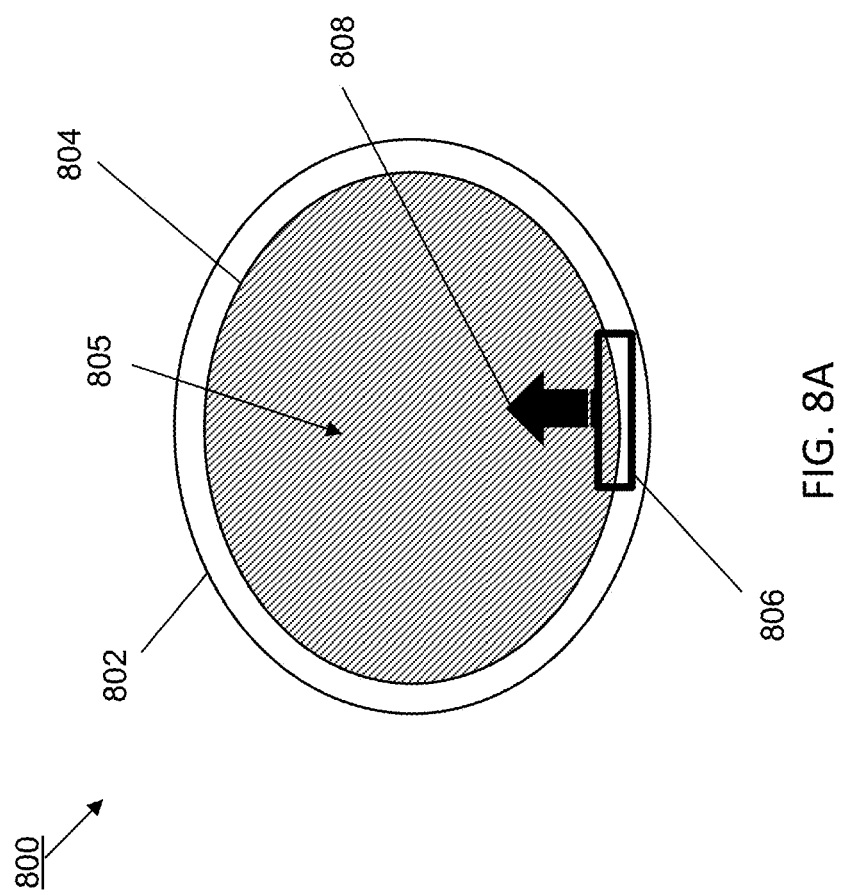
FIG. 8A is a schematic diagram illustrating a top-view of a system for removing particles from a surface according to one or more steps of the method of FIG. 4 and with reference to the systems of FIGS. 5 and 6, in accordance with other embodiments.
Figure 8B:
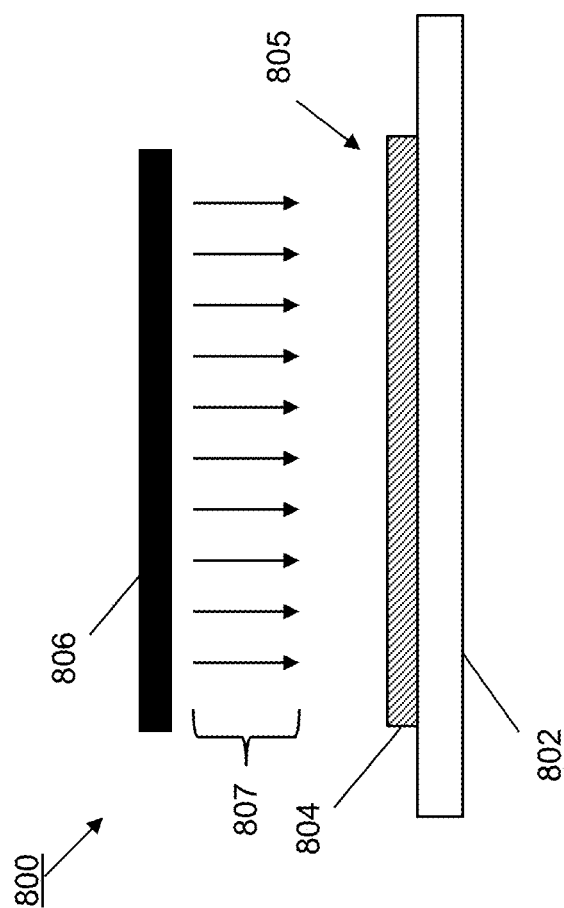
FIG. 8B is a schematic diagram illustrating a side-view of a system for removing particles from a surface according to one or more steps of the method of FIG. 4 and with reference to the systems of FIGS. 5 and 6, in accordance with other embodiments.

Referring now to FIG. 8, an embodiment of a cleaning system 800 is illustrated. In particular, some of the embodiments as described herein may further be applied to clean other EUV optics components such as mirrors, lenses, etc. A contaminated surface of a mirror or other EUV optical component may affect the intensity and quality of an EUV beam and likewise degrade subsequently patterned images. An illustrative embodiment is shown in FIG. 8, where FIG. 8A shows a top-view and FIG. 8B shows a side-view, respectively, of a cleaning system 800. For example, in FIGS. 8A and 8B, a mirror 804 having a surface 805 is disposed on a chuck 802 and positioned for cleaning by the system 800. In various embodiments, a slit 806 as illustrated in FIGS. 8A and 8B may correspond to a portion of systems 500, 600 as discussed above with reference to FIGS. 4-7. As shown in FIG. 8B, the agitated plasma is represented by arrows 807. As discussed above, the system 800 may be implemented to scan across the surface 805 as indicated by arrow 808. In some embodiments, the slit 806 is scanned across the surface 805 using one of a raster scan or a vector scan. In various implementations, the system 800 can also be effectively used to prevent oxidation, carbon contamination, and Sn contamination, as discussed above, of various EUV optics components including mirrors, lenses, etc. More generally, removal of particles or other contamination from the surface 805 by the system 800 may include applying a vacuum at the slit 806, which corresponds to applying a vacuum to the gas purge channels 513 (FIGS. 5 and 6), which is effective for particle and/or other contamination removal as well as for purging of gas/gas mixtures.

The embodiments of the present disclosure offer advantages over existing art, though it is understood that other embodiments may offer different advantages, not all advantages are necessarily discussed herein, and that no particular advantage is required for all embodiments. It will be appreciated that the embodiments of systems and methods of dry cleaning a surface such as, for example, an EUV reticle surface or EUV optics component surface discussed herein provide significant advantages over existing systems and methods. For example, advantages of the systems and methods as discussed herein include preservation of a Ru surface by application of a $H_2$ plasma and/or a $H_2$/inert gas plasma, among others described herein, which can be used to avoid oxidation of and damage to the Ru surface. Moreover, present embodiments that include applying a plasma to clean and/or maintain the cleanliness of a reticle stored in a reticle stocker, as illustrated in FIGS. 2 and 3, offer the further advantage of minimizing/eliminating reticle exposure to ambient air, which could detrimentally oxidize a Ru surface, as the reticle stocker can include an applied gas purging system and/or vacuum environment. Furthermore, application of a plasma to clean a reticle stored in a dual pod carrier, according to various embodiments, offers the advantage of additional protection from particles and other airborne molecular contaminants. Various embodiments described herein, for example as shown and described with reference to FIGS. 4-8, can also be used to mitigate transient cavitation and surface damage, that may be caused for example by megasonic cleaning, by providing for simultaneous surface de-oxidation and particle removal without bubble growth, as described above. Various embodiments thus may be used to effectively remove and prevent oxidation, carbon contamination and Sn contamination, on a variety of surfaces. As discussed herein, in addition to EUV reticles, the systems and methods described may further be used to clean mirrors used for EUV lithography, as well as other EUV optics components.

Thus, one of the embodiments of the present disclosure described a method of removing particles from a surface. In some embodiments, a reticle is placed in a carrier, and a source gas is flowed into the carrier. The method continues to generating a plasma within the carrier using the source gas. Particles are then removed from a surface of the reticle using the generated plasma.

In another of the embodiments, discussed is a system for removing particles from a surface. In various embodiments, the system includes a carrier configured to house a reticle, a reticle stocker including the carrier, a power supply configured to apply a potential between an inner cover and an inner baseplate of the carrier, and a gas source configured to flow a gas into the carrier. In some embodiments, a plasma is generated within the carrier using the gas and the applied potential. Thereafter, in some embodiments, particles are removed from a surface of the reticle using the generated plasma.

In yet another of the embodiments, discussed is a method for removing particles from a surface. In some embodiments, a plasma is generated using a source gas, where an acoustic energy source configured to agitate at least one of the source gas and the generated plasma is provided. Particles are then removed from the surface using an agitated plasma. In some embodiments, prior to generating the plasma, the source gas is agitated using the acoustic energy source. In other embodiments, the generated plasma is agitated using the acoustic energy source.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of removing particles from a surface of a reticle, comprising:
   placing the reticle in a carrier having an inner pod housed in an outer pod, the inner pod having a conductive inner cover and a conductive inner baseplate, the reticle being placed between the inner cover and the inner baseplate with a patterned surface of the reticle facing the inner baseplate and spaced from the inner baseplate;
   flowing a source gas into the carrier;
   generating a plasma within the inner pod of the carrier using the source gas by applying a voltage potential between the inner cover and the inner baseplate; and
   removing particles from the patterned surface of the reticle using the generated plasma.

2. The method of claim 1, wherein the removing further includes removing particles from the surface using a hydrogen radical, wherein the hydrogen radical is produced by heating the molecular hydrogen to a temperature above about 1700° C.

3. The method of claim 1, further including prior to generating the plasma, applying a voltage to the carrier.

4. A system for removing particles from a surface of a reticle, comprising:
- a carrier configured to house the reticle, wherein the carrier includes an inner pod housed in an outer pod, the inner pod includes a conductive inner cover and a conductive inner baseplate, the inner cover and the inner baseplate are configured to sandwich the reticle with a patterned surface of the reticle facing the inner baseplate and spaced from the inner baseplate;
- a reticle stocker including the carrier;
- a power supply configured to apply a potential between the conductive inner cover and the conductive inner baseplate of the carrier; and
- a gas source configured to flow a gas into the carrier, wherein the gas includes a mixture of molecular hydrogen or water vapor and an inert gas selected from a group consisting of neon, argon, krypton, xenon, and radon;
- wherein the system is configured to generate a plasma between the conductive inner cover and the conductive inner baseplate using the gas and the applied potential to remove particles from the patterned surface of the reticle.

5. The system of claim 4, wherein the power supply includes one of a direct current (DC) power supply and a radio frequency (RF) power supply.

6. The system of claim 4, wherein the mixture has a hydrogen concentration of less than about 3 percent.

7. A method of removing particles from an EUV mask surface using a cleaning system, the method comprising:
- flowing a source gas through a gas supply channel;
- generating plasma using the source gas by a voltage potential applied between first and second electrodes that are disposed in the gas supply channel and are coupled to a power supply, wherein the source gas includes molecular hydrogen or water vapor;
- providing an acoustic energy source, which is disposed in the gas supply channel and is proximate to and either downstream or upstream of the first and second electrodes, configured to agitate at least one of the source gas and the generated plasma;
- exposing the EUV mask surface to the agitated plasma via a slit that corresponds to an end portion of the cleaning system and that has a width smaller than the EUV mask surface, wherein exposing the EUV mask surface to the agitated plasma comprises scanning the slit across the EUV mask surface;
- removing particles from the EUV mask surface using the agitated plasma; and
- purging the removed particles via a gas purge channel using an applied vacuum.

8. The method of claim 7, wherein prior to generating the plasma, agitating the source gas using the acoustic energy source.

9. The method of claim 7, further including agitating the generated plasma using the acoustic energy source.

10. The system of claim 4, wherein the water vapor has a temperature less than 100° C.

11. The system of claim 4, wherein the water vapor has a temperature ranging from 10° C. to 40° C.

12. The system of claim 4, further comprising an acoustic energy source configured to generate the water vapor.

13. The system of claim 4, wherein the carrier includes an outer pod and the source gas is directed within the carrier through ports in the outer pod.

14. The system of claim 4, further comprising a plasma source coupled to the reticle stocker through a conduit.

15. The method of claim 7, wherein the source gas includes the water vapor.

16. The method of claim 7, wherein the source gas includes the molecular hydrogen.

17. The method of claim 4, wherein the gas includes molecular hydrogen plasma, and wherein the plasma comprises hydrogen radical produced by heating the molecular hydrogen to a temperature above about 1700° C.

18. The method of claim 4, wherein the reticle is a mirror.

19. The method of claim 7, wherein the EUV mask surface comprises ruthenium (Ru).

20. The method of claim 9, wherein the agitated plasma comprises hydrogen radical, wherein the particles comprise tin (Sn), and wherein the removed particles comprise $SnH_4$ produced by the reaction of the hydrogen radical and the tin.

* * * * *